United States Patent
Jo et al.

(10) Patent No.: US 9,875,782 B2
(45) Date of Patent: Jan. 23, 2018

(54) MAGNETIC MEMORY DEVICE AND OPERATING METHOD THEREOF

(71) Applicants: SK hynix Inc., Icheon (KR); Industry-Academic Cooperation Foundation, Yonsei University, Seoul (KR)

(72) Inventors: Kangwook Jo, Goyang (KR); Jongil Hong, Seoul (KR); Hongil Yoon, Seoul (KR)

(73) Assignees: SK HYNIX INC., Icheon (KR); INDUSTRY—ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/401,871

(22) Filed: Jan. 9, 2017

(65) Prior Publication Data
US 2017/0221541 A1    Aug. 3, 2017

(30) Foreign Application Priority Data
Feb. 2, 2016   (KR) .................. 10-2016-0013019

(51) Int. Cl.
*G11C 11/00*   (2006.01)
*G11C 11/16*   (2006.01)

(52) U.S. Cl.
CPC ........ *G11C 11/1675* (2013.01); *G11C 11/161* (2013.01); *G11C 11/1697* (2013.01)

(58) Field of Classification Search
CPC .......................................... G11C 11/00–11/06

USPC .................................. 365/158, 171, 173, 148
See application file for complete search history.

(56) References Cited

U.S. PATENT DOCUMENTS

| | | | |
|---|---|---|---|
| 2006/0209585 A1* | 9/2006 | Tanizaki | G11C 11/56 365/148 |
| 2010/0118581 A1* | 5/2010 | Okayama | G11O 5/025 365/51 |
| 2014/0145279 A1 | 5/2014 | Kato et al. | |

FOREIGN PATENT DOCUMENTS

KR   10-2014-0113174 A   9/2014

OTHER PUBLICATIONS

Ioan Mihai Miron et al., "Perpendicular switching of a single ferromagnetic layer induced by in-plane current injection", Nature, Aug. 11, 2011, pp. 189-194, vol. 476, Macmillan Publishers Limited.

(Continued)

*Primary Examiner* — Han Yang (57) ABSTRACT

A magnetic memory device may include a bit line, a plurality of source lines, a plurality of normal cells coupled between the bit line and the plurality of source lines, and each including a magnetic resistance element and a switching element coupled in series to the magnetic resistance element and switched by a word line signal, a dummy cell coupled to the bit line, and a spin-hall effect material layer between the bit line and the magnetic resistance element. The magnetic resistance element may write data according to a first current that flows through the dummy cell and flows in a direction parallel to the magnetic resistance element, and a second current that flows through the magnetic resistance element.

17 Claims, 12 Drawing Sheets

(56) References Cited

OTHER PUBLICATIONS

Ioan Mihai Miron et al., "Current-driven spin torque induced by the Rashba effect in a ferromagnetic metal layer", Nature Materials, Jan. 10, 2010, pp. 230-234, vol. 9.
Alexandr Chernyshov et al., "Evidence for reversible control of magnetization in a ferromagnetic material by means of spin-orbit magnetic field", Nature Physics, Aug. 2, 2009, pp. 656-659, vol. 5, Macmillan Publishers Limited.

* cited by examiner

MAGNETIC MEMORY DEVICE AND OPERATING METHOD THEREOF

CROSS-REFERENCE TO RELATED APPLICATIONS

The present application claims priority of Korean Patent Application No. 10-2016-0013019, filed on Feb. 2, 2016, which is incorporated herein by reference in its entirety.

BACKGROUND

1. Field

Exemplary embodiments of the present invention relate to a magnetic memory device and an operating method thereof, and more particularly, to a magnetic memory device which uses both the STT (Spin Transfer Torque) effect and the SOT (Spin Orbit Torque) effect to write data, and an operating method thereof.

2. Description of the Related Art

Magnetic memory is one of leading next-generation memory device technologies. Recently, research has been conducted on magnetic memory devices using the STT effect and the SOT effect.

Figure 1:
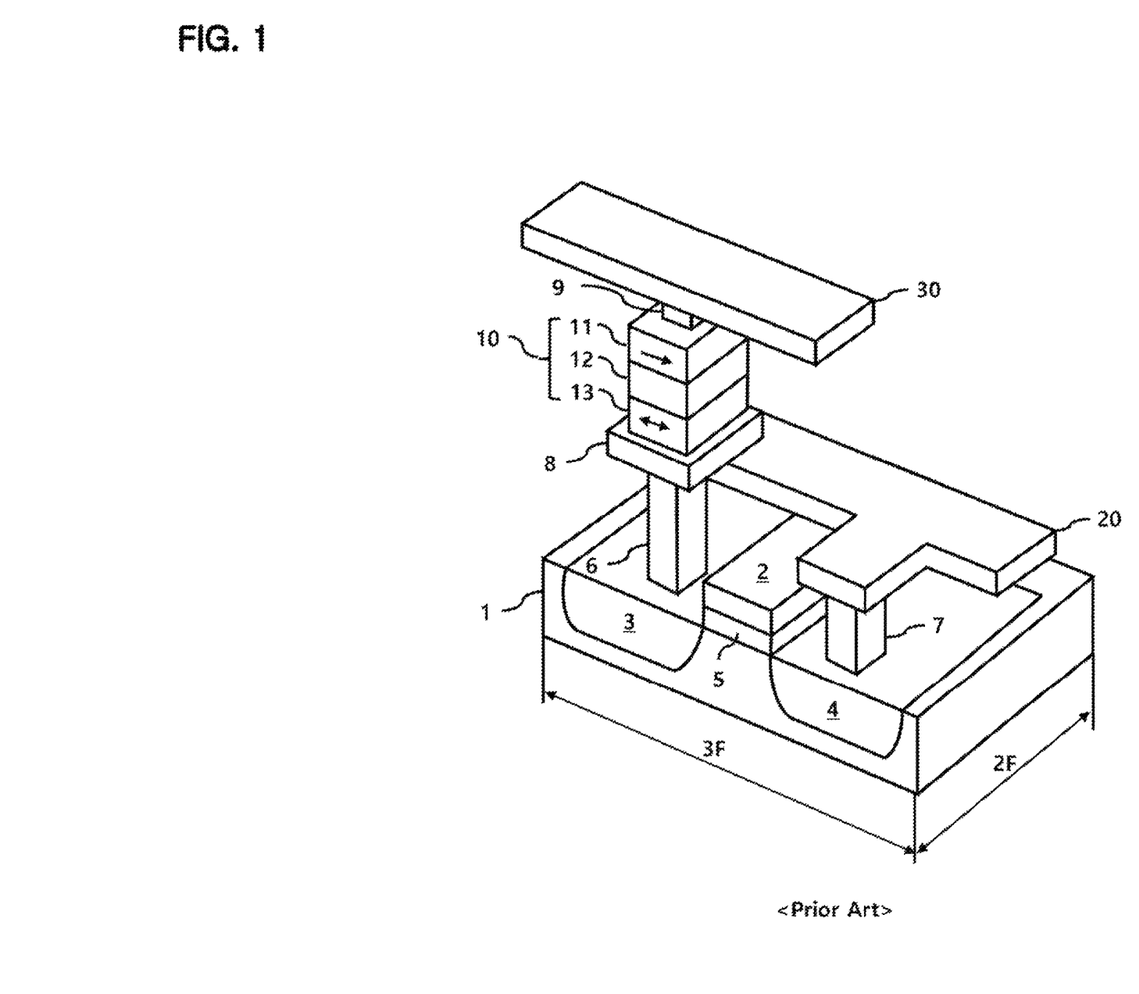
FIG. 1 is a diagram illustrating a cell structure of a conventional magnetic memory device using the STT effect.

FIG. 1 is a structure diagram of a conventional magnetic memory cell that uses the STT effect.

The magnetic memory cell using the STT effect includes a word line 2 formed over a substrate 1, a drain 3 and source 4 formed in the substrate 1 on opposing sides of the word line 2, and a gate insulating layer 5 formed between the substrate 1 and the word line 2.

The magnetic memory cell further includes a drain electrode 6, a source electrode 7, a metal layer 8, an MTJ (Magnetic Tunnel Junction) element 10, a bit line electrode 9, a bit line 30 and a source line 20. The drain electrode 6 is formed on the drain 3, and the source electrode 7 is formed on the source 4. The metal layer 8, the MTJ element 10, the bit line electrode 9 and the bit line 30 are sequentially formed over the source electrode 7, and the source line 20 is formed over the drain electrode 6.

As illustrated in FIG. 1, the magnetic memory cell occupies an area of $6F^2$.

The MTJ element 10 includes a fixed layer 11 for which the spin is fixed, a barrier layer 12 and a free layer 13 of which the spin is variable.

The magnetic memory device using the STT effect writes data by applying a current through the MTJ element 10 to adjust the spin orientation of the free layer 13 of the MTJ element 10, and reads data according to a resistance or current difference which occurs depending on the spin orientation of the free layer 13. That is, current flows through MTJ element 10 during read and write operations. A write operation using the STT effect may be referred to as current-induced switching, which is caused by a current that is perpendicular to the layers of the MTJ element 10.

The magnetic memory device using the STT effect uses a large magnitude of current in order to adjust the spin orientation. Thus, while the power consumption of the magnetic memory device is increased, the durability thereof may be reduced by stress applied to the MTJ element 10.

Figure 2:
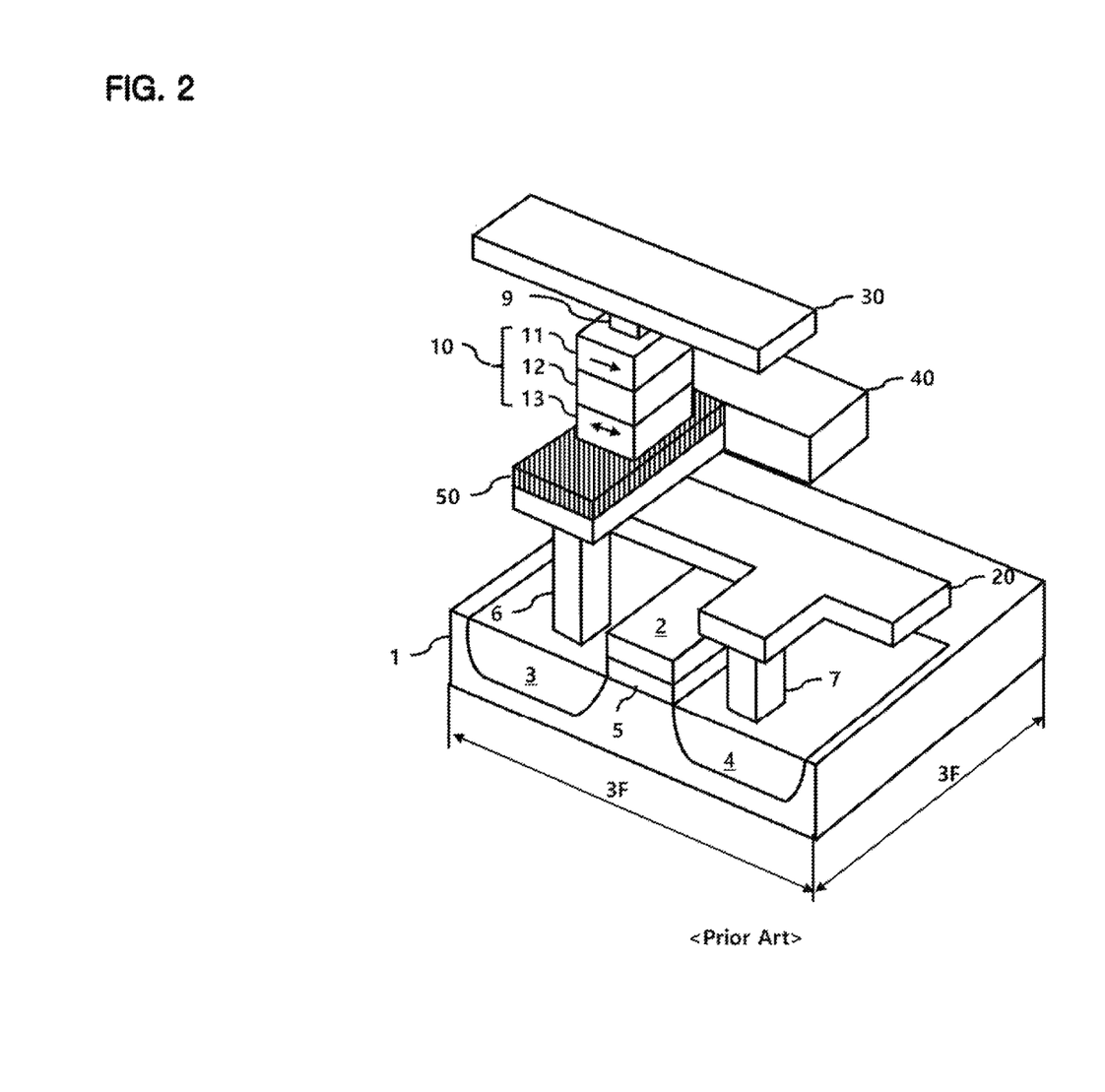
FIG. 2 is a diagram illustrating a cell structure of a conventional magnetic memory device using the SOT effect.

FIG. 2 is a structure diagram of a conventional magnetic memory cell that uses the SOT effect.

The magnetic memory cell using the SOT effect includes a word line 2 formed over a substrate 1, a drain 3 and source 4 formed in the substrate 1 on opposing sides of the word line 2, and a gate insulating layer 5 formed between the substrate 1 and the word line 2.

The magnetic memory cell further includes a drain electrode 6, a source electrode 7, a write line 40, an MTJ element 10, a bit line electrode 9, a bit line 30 and a source line 20. The drain electrode 6 is formed on the drain 3, and the source electrode 7 is formed on the source 4. The write line 40, the MTJ element 10, the bit line electrode 9 and the bit line 30 are sequentially formed over the drain electrode 6, and the source line 20 is formed over the source electrode 7.

At the top of the write line 40 adjacent to the free layer 13 of the MTJ element 10, a spin-hall effect material layer 50 is formed.

In the magnetic memory device using the SOT effect, current flows between the write line 40 and the drain 3 during a data write operation.

That is, current which flows in a direction parallel to the MTJ element 10 through the write line 40 causes a spin-hall effect in the spin-hall effect material layer 50, which causes the spin direction of the free layer 13 to change in a write operation. In other words, the SOT effect changes the state of a memory cell by field-induced switching, where the field is caused by current flowing parallel to the layer surfaces, or layer orientation, of the MTJ element 10.

During a read operation, a current flows through the MTJ element 10 and the drain 3 via the bit line 30. According to a resistance or current difference which occurs depending on the spin orientation of the free layer 13 during the read operation, data are identified.

The magnetic memory device using the SOT effect does not directly apply a current to the MTJ element 10 during a write operation, but additionally includes the write line 40. Thus, the structure of memory cell of an SOT device is more complex than that of cell of an STT device, so the size of a unit cell in an SOT device is larger than a unit cell in an STT device. As illustrated in FIG. 2, the magnetic memory cell using the SOT effect occupies an area of $9F^2$.

Therefore, a conventional magnetic memory device which perform write operations using the STT effect use large amounts of energy, while a conventional device that uses the SOT suffers from a larger cell size.

SUMMARY

Various embodiments are directed to a magnetic memory device which performs a write operation using the STT effect and the SOT effect, and an operating method thereof.

In an embodiment, a magnetic memory device may include: a bit line; a plurality of source lines; a plurality of normal cells coupled between the bit line and the plurality of source lines, each normal cell including a magnetic resistance element and a switching element coupled in series to the magnetic resistance element and each switching element being switched by a word line signal; a dummy cell coupled to the bit line; and a spin-hall effect material layer formed adjacent to the bit line and the magnetic resistance element. Data may be written to the magnetic resistance element using a first current that flows through the dummy cell and parallel to the magnetic resistance element and a second current that flows through the magnetic resistance element.

In an embodiment, a magnetic memory device may include: a bit line; a plurality of source lines; a plurality of magnetic memory cells coupled between the bit line and the plurality of source lines, each cell including a magnetic resistance element and a switching element coupled in series to the magnetic resistance element and switched by a word line signal; a spin-hall effect material layer adjacent to the bit line and the magnetic resistance element; a first driver coupled to a first terminal of the bit line and configured to supply a current to the bit line or sink a current from the bit line; and a fourth driver coupled to a second terminal of the bit line and configured to supply a current to the bit line or sink a current from the bit line. The magnetic resistance element may write data according to a first current that is parallel to the magnetic resistance element and a second current that flows through the magnetic resistance element.

In an embodiment, an operating method of a magnetic memory device may include: a first step of retrieving write data to be written to a plurality of magnetic memory cells sharing a bit line according to a write request, the write data including more of a first type of data than a second type of data; a second step of writing the first type of data simultaneously to all cells of the plurality of magnetic memory cells; and a third step of writing the second type of data to a portion of the plurality of magnetic memory cells, the second type of data being different from the first type of data.

DETAILED DESCRIPTION

Hereafter, various embodiments will be described below in more detail with reference to the accompanying drawings.

Figure 3:
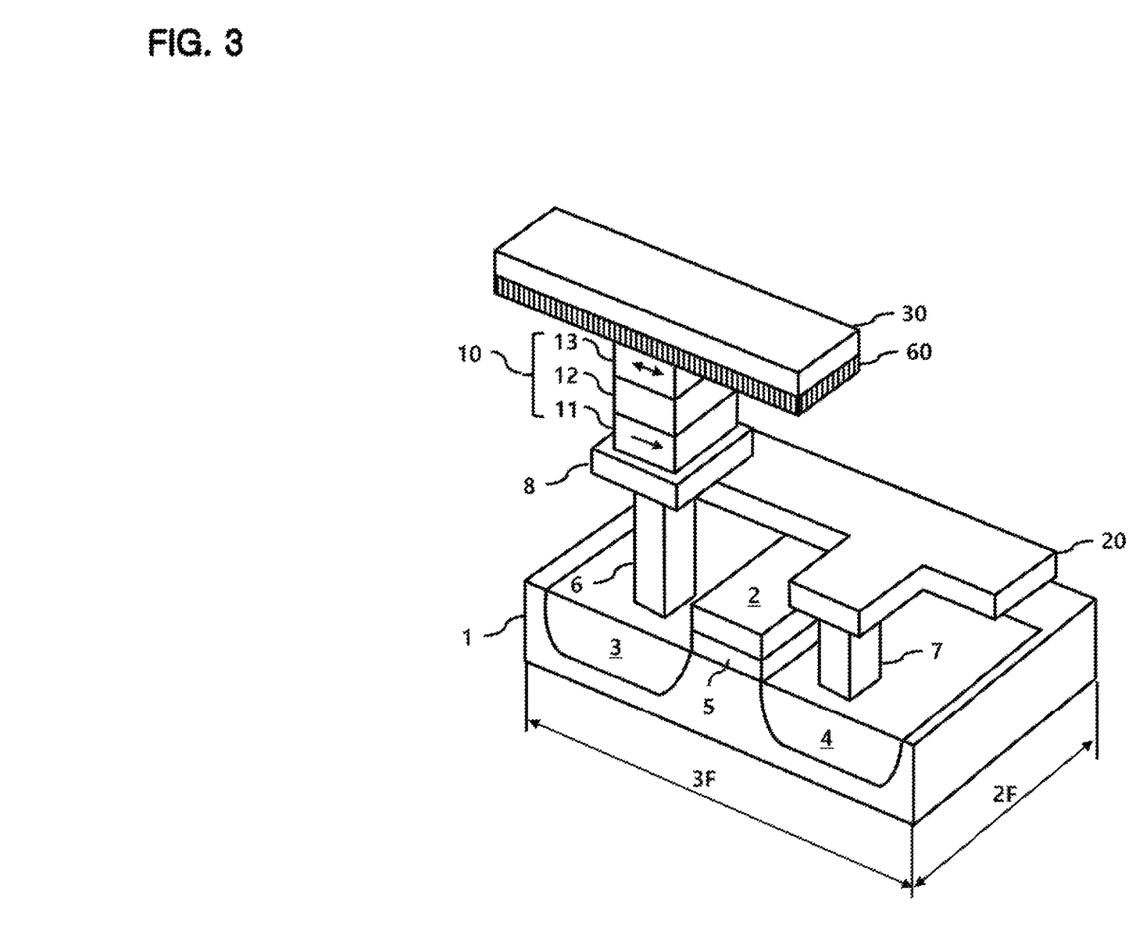
FIG. 3 is a diagram illustrating a cell structure of a magnetic memory device according to a first embodiment.

FIG. 3 is a diagram illustrating a cell structure of a magnetic memory device according to a first embodiment.

The magnetic memory cell according to the first embodiment includes a word line 2 formed over a substrate 1, a drain 3 and source 4 formed in the substrate 1 at both sides of the word line 2, and a gate insulating layer 5 formed between the substrate 1 and the word line 2.

The magnetic memory cell according to the first embodiment includes a source electrode 7 formed on the source 4 and a drain electrode 6 formed on the drain 3.

The magnetic memory cell according to the first embodiment includes a metal layer 8, an MTJ element 10, a bit line 30, which are sequentially formed over the drain electrode 6, and a source line 20 formed on the source electrode 7.

The magnetic memory cell according to the first embodiment includes a spin-hall effect material layer 60 formed under the bit line 30.

In the MTJ element 10, a free layer 13 is formed adjacent to the spin-hall effect material layer 60, and a fixed layer 11 is formed adjacent to the metal layer 8. In an embodiment, the free layer 13 is in physical contact with the spin-hall effect layer 60 and the fixed layer 11 is in physical contact with metal layer 8. The free layer 13 is separated from the fixed layer 11 by a barrier layer 12.

Since the magnetic memory cell according to the first embodiment does not include a write line, the area of the unit cell can be reduced to $6F^2$.

In the magnetic memory cell according to the first embodiment, when a write operation is performed using only the STT effect, a plurality of cells coupled to the bit line 30 may be simultaneously affected by the spin-hall effect. When all of the cells are simultaneously affected in this manner, a random access operation is impossible.

Thus, the magnetic memory cell according to the first embodiment performs a write operation using the SOT effect and the STT effect at the same time.

In the first embodiment, current flowing through the bit line 30 may include a first current parallel to the free layer 13 and a second current perpendicular to the free layer 13 through the MTJ element 10. In an embodiment, the term "parallel" refers to running alongside a planar surface of the MTJ element 10. The arrows on free layer 13 in FIG. 3 show such a parallel orientation. In contrast, the term "perpendicular" in refers to a longitudinal direction of the MTJ element 10, which is perpendicular to the planar surface.

The first current is represented by $I_{sot}$, the second current is represented by $I_{stt}$, and the write current flowing through the bit line 30 is represented by $I_b$, and the relation between these currents in an embodiment in which both currents are applied to the bit line 30 is expressed in Equation 1 below.

$$I_b = I_{sot} + I_{stt} \quad \text{[Equation 1]}$$

Figure 4:
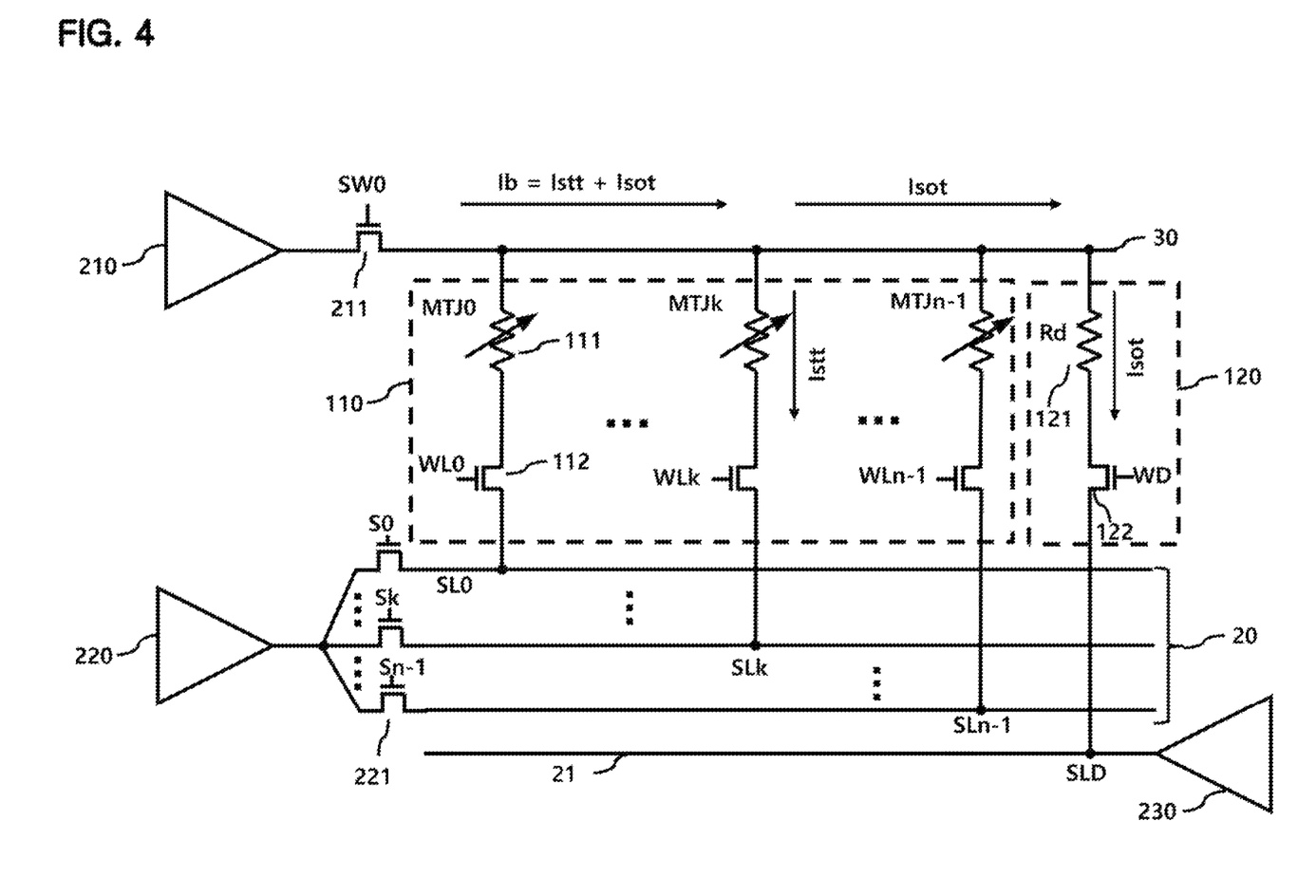
FIG. 4 is a circuit diagram of the magnetic memory device according to the first embodiment.

FIG. 4 illustrates a magnetic memory device according to the first embodiment.

FIG. 4 illustrates cells which are commonly coupled to one bit line among a plurality of bit lines included in the magnetic memory device and surrounding elements.

As is well known, a magnetic memory device includes a plurality of bit lines, and it is apparent to a person of ordinary skill in the art that even though FIG. 4 only shows a single bit line 30, an actual device will include a plurality of such bit lines 30.

A magnetic memory device according to the present embodiment includes a plurality of source lines 20, a bit line 30, a plurality of normal cells 110 coupled between the bit line 30 and the source lines 20, a dummy cell 120 coupled to the bit line 30, and a first driver 210 configured to provide a current to the bit line 30 or sink a current from the bit line 30. Here, the term "normal" refers to a cell that stores data according to a memory write operation, and for which the stored data is read according to a memory read operation.

The first driver 210 may be coupled to the bit line 30 through a bit line select switch 211 which is controlled according to a bit line select signal SW0.

The magnetic memory device according to the present embodiment may further include a second driver 220 which provides a current to the source line 20 or sinks a current from the source line 20.

The second driver 220 may be coupled to any one source line 20 through the source line select switch 221 which is controlled according to a source line select signal Sk (k=0, 1, . . . , n−1, where n is a natural number larger than 1).

The magnetic memory device according to the present embodiment may further include a third driver 230 which provides a current to a dummy source line 21 or sinks a current from the dummy source line 21.

Each of the normal cells 110 includes an MTJ element 111 and a transistor 112 coupled to the MTJ element 111.

The gate of each transistor 112 is coupled to a corresponding word line, and the source and drain of each transistor 112 are electrically coupled to the MTJ element 111 and the source line 20 for each cell 110, respectively.

The dummy cell 120 includes a resistor 121 and a dummy transistor 122 coupled to the resistor 121.

The resistor 121 of the dummy cell 120 may be a passive element or active element of which the resistance value is fixed or varied.

The gate of the dummy transistor 122 is coupled to a dummy word line WD, and the source and drain of the dummy transistor 122 are coupled to the resistor 121 and the dummy source line 21, respectively.

In the present embodiment, the dummy source line 21 is present between the dummy transistor 122 and the third driver 230. In another embodiment, however, the dummy source line 21 may not be included.

In such an embodiment, the third driver 230 may be directly coupled to the dummy transistor 122 without the dummy source line 21 therebetween.

FIG. 4 illustrates a write operation which is performed on a normal cell corresponding to a k-th word line and a zeroth bit line.

The first driver 210 provides a bit line current $I_b$ to the bit line 30.

In an embodiment, the bit line current $I_b$ includes a first current $I_{sot}$ that flows parallel to the free layer of an MTJ element 111, and a second current $I_{stt}$ that flows through the MTJ element 111.

Thus, the k-th MTJ element performs a write operation using a SOT effect by the first current $I_{sot}$ and a STT effect by the second current $I_{stt}$ at the same time.

The magnitudes of the currents may be controlled by adjusting the driving characteristic or characteristics of one or two or more of the first to third drivers 210 to 230.

The magnitude of the first current $I_{sot}$ may be controlled by adjusting the resistance value Rd of the resistor 121 of the dummy cell 120.

An SOT effect caused by the sum of the first and second currents $I_{sot}$ and $I_{stt}$, that is, the entire bit line current $I_b$ acts on the zeroth to (k−1)th MTJ elements, and an SOT effect caused by the first current $I_{sot}$ acts on the (k+1)th to n-th MTJ elements.

However, in an embodiment of the present disclosure, a write operation is only performed on MTJ the k-th MTJ element out of the MTJ elements coupled to the same bit line.

Thus, the structure or operation condition of the cell may be set in such a manner that the spin of the free layer of the MTJ element is not changed by the SOT effect by the sum of the first and second currents $I_{sot}$ and $I_{stt}$, that is, the entire bit line current $I_b$.

When the minimum magnitude of switching torque for switching the spin of the free layer of the MTJ element is represented by $T_m$, the amount of current sufficient for performing a write operation in the k-th MTJ element is expressed by Equation 2 below.

In the following Equations, the term "a" represents a proportional constant that for the relation between the current $I_{sot}$ parallel to the MTJ element and the torque generated by the SOT effect, and the term "b" represents a proportional constant for the relation between the current $I_{stt}$ perpendicular to the MTJ element and the torque generated by the STT effect.

The proportional constant a may depend on the composition and physical size of the spin-hall effect material layer, and the proportional constant b may depend on the composition and physical size of the MTJ element.

$$aI_{sot} + bI_{stt} > T_m \qquad \text{[Equation 2]}$$

As described above, in a write operation for a single cell of a memory device according to an embodiment of this disclosure, a spin change does not occur in MTJ elements other than the k-th MTJ element. Thus, Equations 3 and 4 below are satisfied at the same time.

$$aI_b = a(I_{sot} + I_{stt}) < T_m \qquad \text{[Equation 4]}$$

$$aI_{sot} < T_m \qquad \text{[Equation 4]}$$

Based on Equations 2, 3 and 4, a relation expressed as Equation 5 below may be obtained.

$$b > a, I_{sot} < T_m/a \qquad \text{[Equation 5]}$$

When data of the k-th memory cell is read, the transistor 122 of the dummy cell 120 is blocked.

Thus, a read current provided from the first driver 210 may be provided to the k-th MTJ element to perform a read operation.

At this time, the read current is set in such a manner that a write by the SOT effect does not occur during the read operation.

Figure 5:
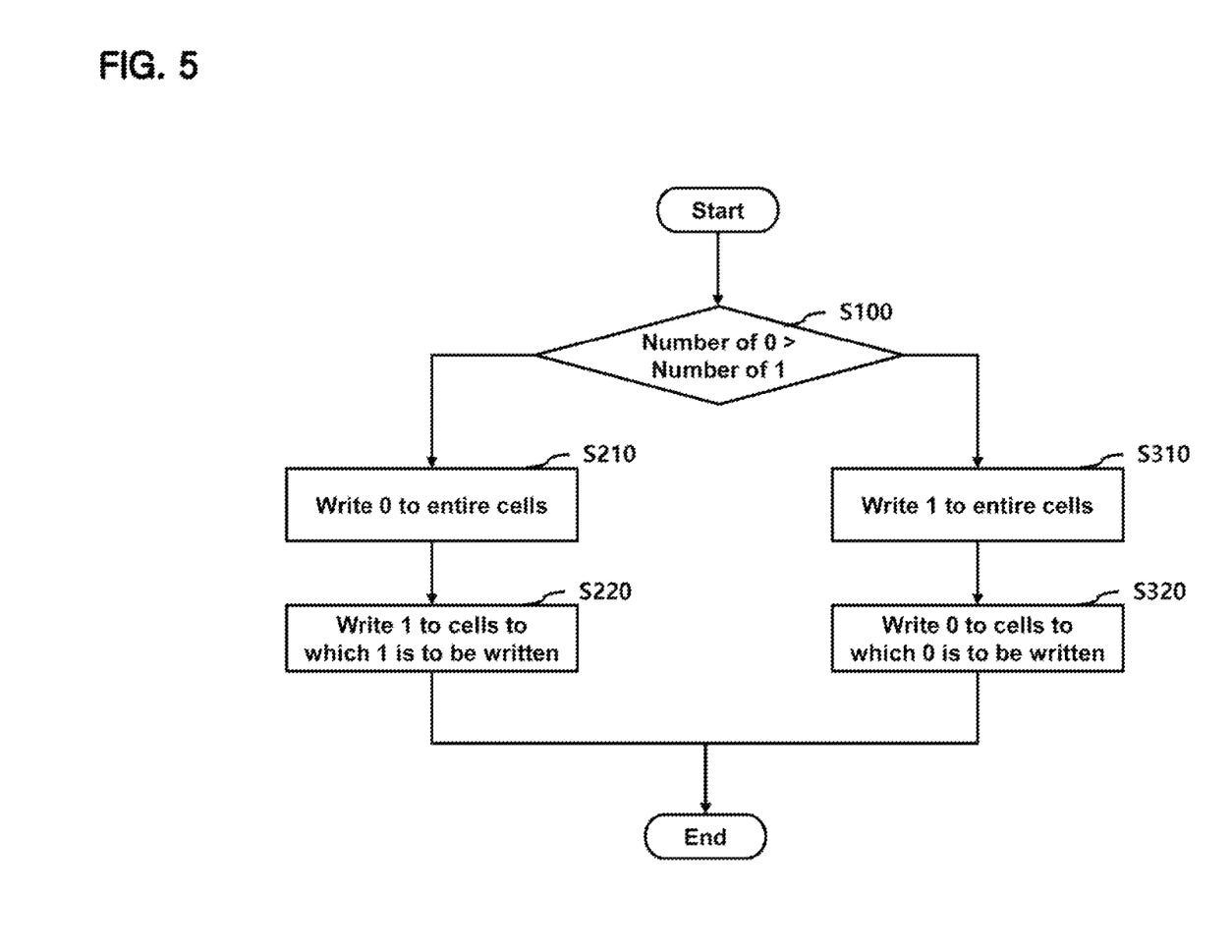
FIG. 5 is a flowchart illustrating a write operation of the magnetic memory device according to the first embodiment.

FIG. 5 is a flowchart illustrating a write operation of the magnetic memory device according to the present embodiment, and FIGS. 6 to 9 illustrate the write operation of FIG. 5.

FIG. 5 is based on an embodiment in which a plurality of cells share a single bit line.

First, the magnetic memory device compares the number of bits corresponding to 0 in data to be written to the number of bits corresponding to 1 in the data, at step S100.

When the number of bits corresponding to 0 is larger than the number of bits corresponding to 1, 0 is written to every cell of the plurality of cells at step S210.

Figure 6:
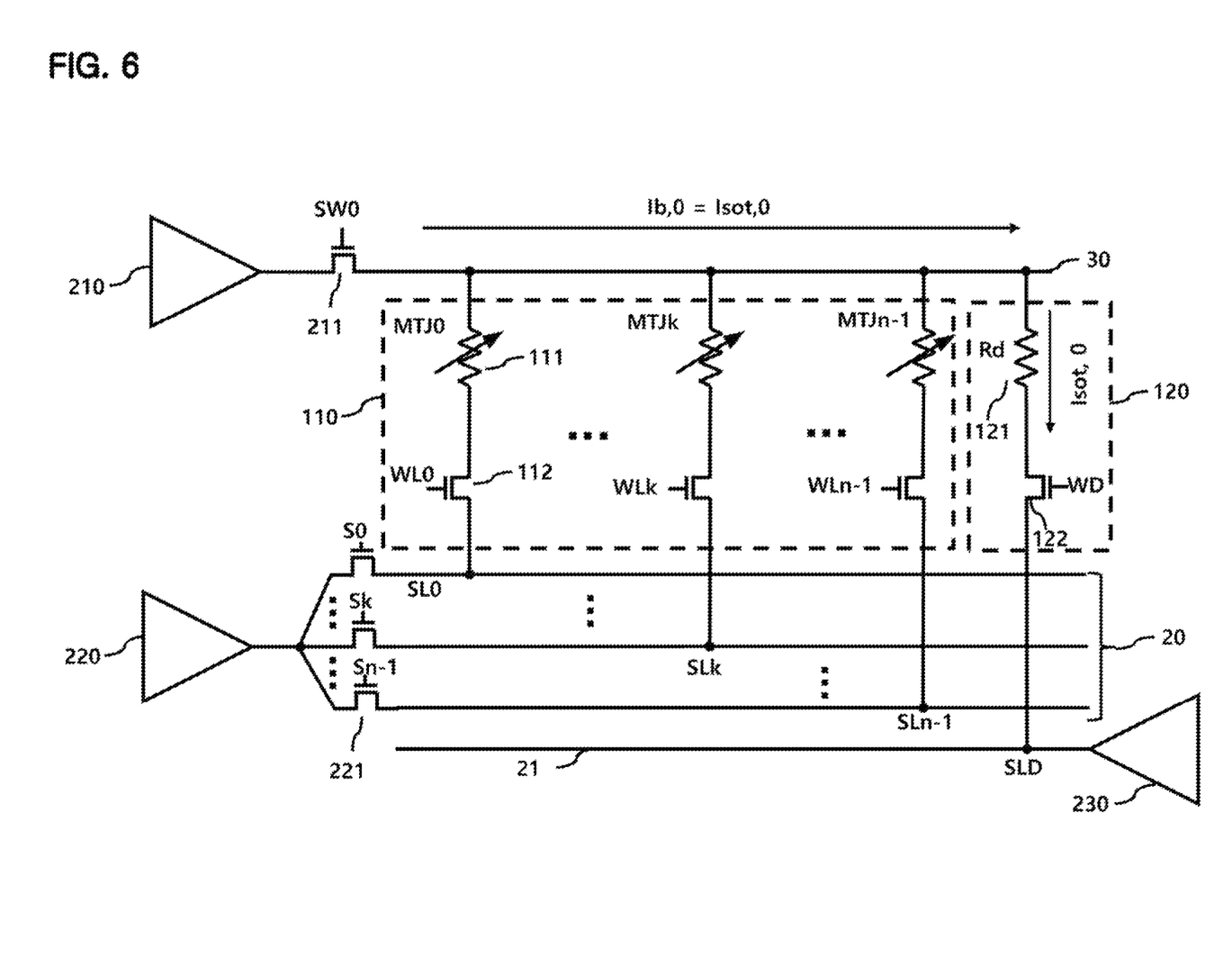
FIGS. 6 to 9 are diagrams illustrating write operations of FIG. 5.

The operation of writing 0 to the entire cells is illustrated in FIG. 6.

The operation of writing 0 to every cell in the plurality of cells may use the SOT effect.

For this operation, the first driver 210 provides a bit line current ($I_{b,0} = I_{sot,0}$) in a state where the transistors 112 included in the normal cells 110 are all turned off and the transistor 122 included in the dummy cell 120 is turned on. The third driver 230 may sink the bit line current $I_{b,0}$, and the bit line current $I_{b,0}$ to satisfies Equation 6 below.

$$aI_{b,0} > T_m \qquad \text{[Equation 6]}$$

Then, 1 is written to cells to which 1 is to be written, at step S220.

At this time, when there are no cells to which 1 is to be written, the operation is ended.

Figure 7:
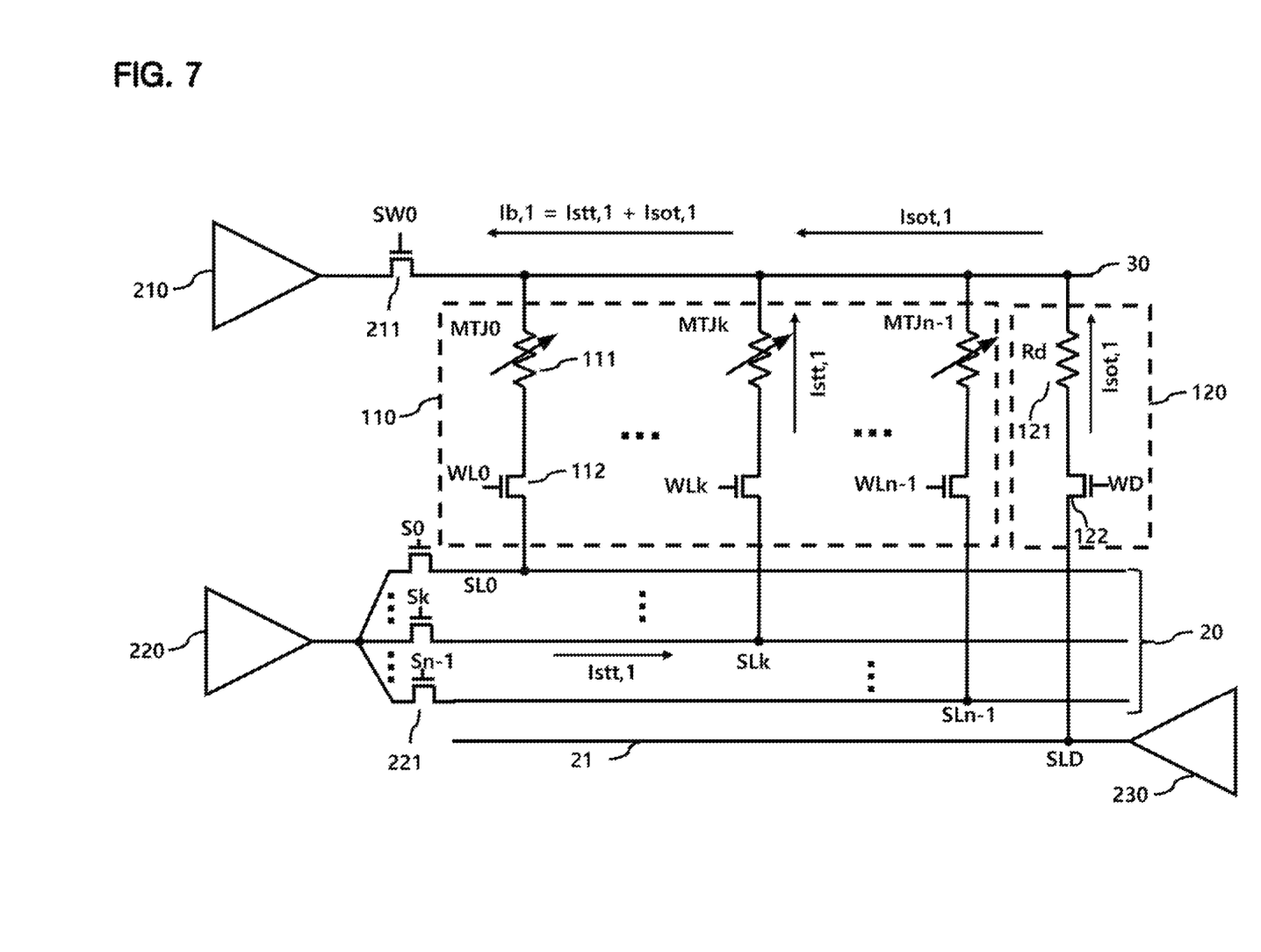

An operation of writing 1 to one cell is illustrated by FIG. 7, and may be sequentially performed on all cells to which 1 is to be written.

The operation of writing 1 to each cell separately may use the SOT effect and the STT effect at the same time.

FIG. 7 shows an operation of writing a bit value "1" to the k-th normal cell. During the operation of writing 1, the direction of the current may be set in the opposite direction to the current direction of FIG. 6.

For this operation, the third driver 230 provides the first current $I_{sot,1}$ to the dummy cell 120, and the second driver 220 provides the second current $I_{stt,1}$ through the k-th source line 20. The first driver 210 may sink the bit line current ($I_{b,1} = I_{sot,1} + I_{stt,1}$).

In this case, the relation of Equation 5 is satisfied, in order to suppress an influence on the other cells excluding the cell to which data are written.

When the number of bits corresponding to 0 is not larger than the number of bits corresponding to 1, 1 is written to all cells of the plurality of cells coupled to the same bit line 30 at step S310.

Figure 8:
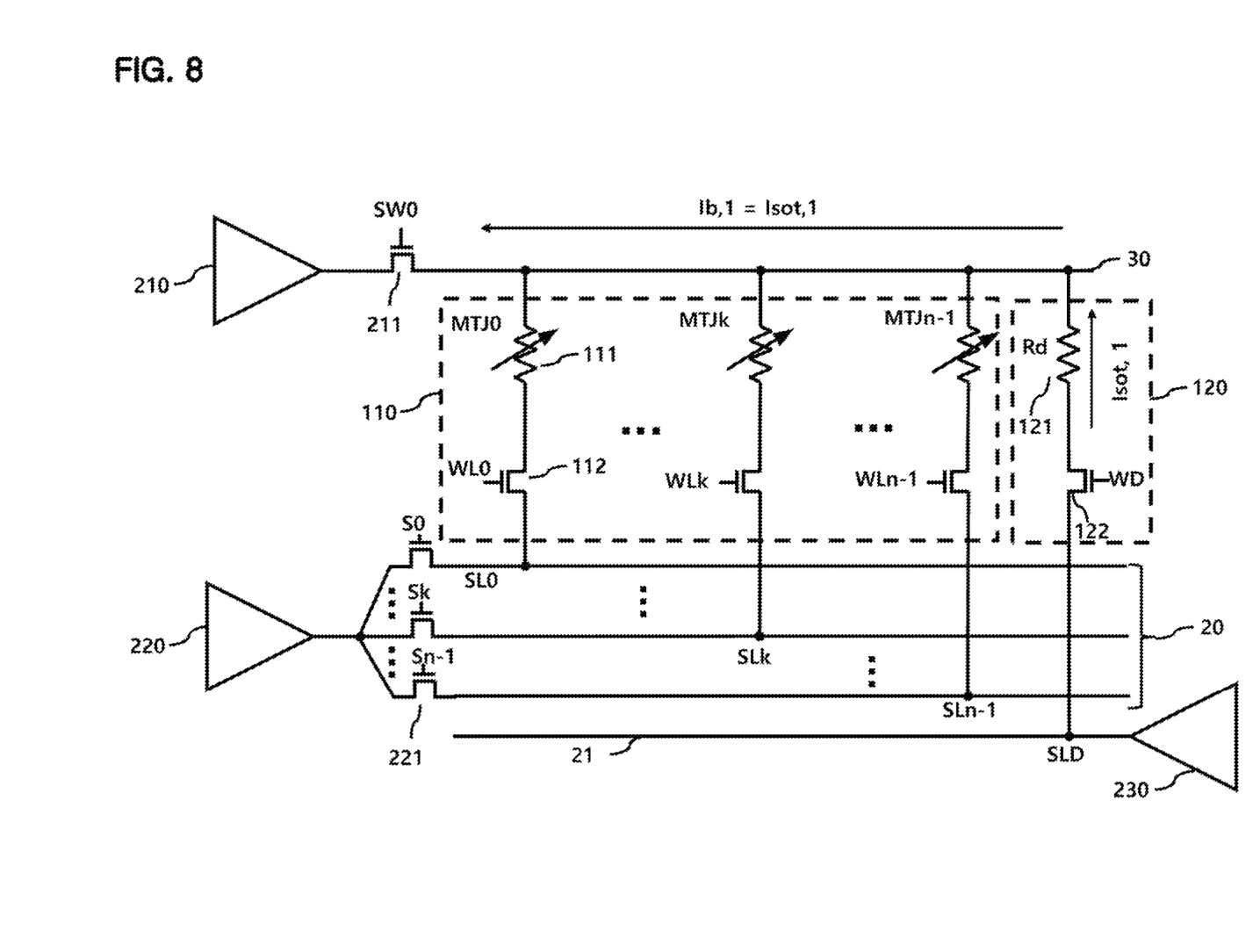

An operation of writing 1 to the entire cells is illustrated in FIG. 8.

An operation of writing 1 to the entire cells may use the SOT effect.

For this operation, the third driver 230 provides a bit line current ($I_{b,1}=I_{sot,1}$) in a state where the transistors 112 included in the normal cells 110 are all turned off and the transistor 122 included in the dummy cell 120 is turned on. The first driver 210 may sink the bit line current $I_{b,1}$, and the bit line current $T_{b,1}$ satisfies Equation 7 below.

$$aI_{b,1} > T_m \quad \text{[Equation 7]}$$

Then, a bit value "0" is written to cells to which 0 is to be written, at step S320.

At this time, when there are no cells to which 0 is to be written, the write operation is ended.

Figure 9:
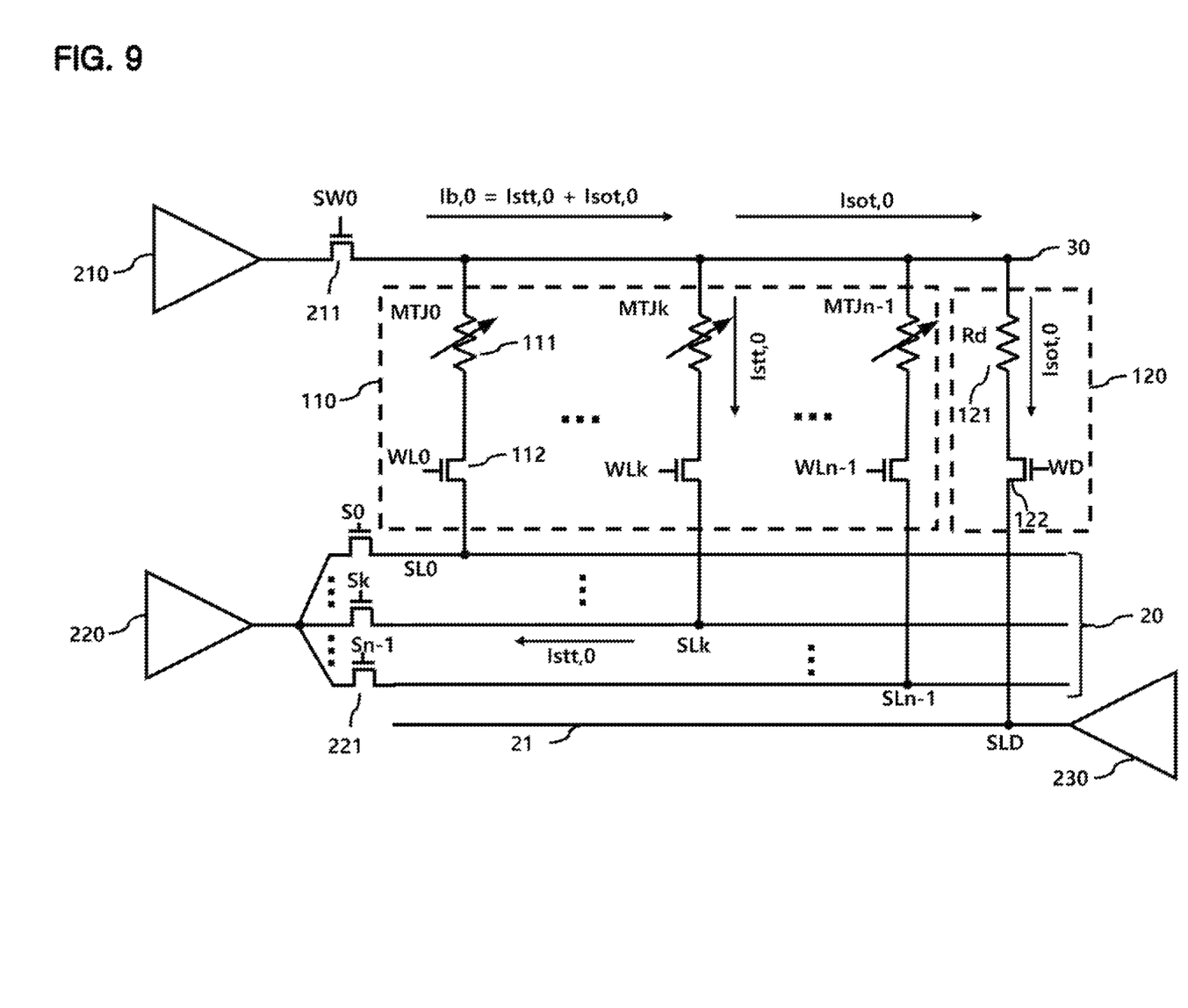

An operation of writing 0 to an individual cell is illustrated by FIG. 9, and may be sequentially performed on the cells to which 0 is to be written.

As described above, the operation of writing 0 to each cell uses the SOT effect and the STT effect at the same time.

FIG. 9 illustrates an operation of writing 0 to the k-th memory cell. During the operation of writing 0, the direction of the current may be set in the opposite direction to the current direction of FIG. 8.

For this operation, the first driver 210 may provide a bit line current ($I_{b,0}=I_{sot,0}+I_{stt,0}$). The first current $I_{sot,0}$ may be sunk through the third driver 230 via the dummy cell 120, and the second current $I_{stt,0}$ may be sunk to the second driver 220 through the k-th normal cell and the source line 20.

In this case, the relation of Equation 5 is satisfied in order to suppress an influence on the other cells excluding the cell to which data are written.

When a write operation is performed through an embodiment according to the method described with reference to FIGS. 5 to 9, a total number of data write operations can be reduced, which makes it possible to improve the operation performance of the magnetic memory.

Figure 10:
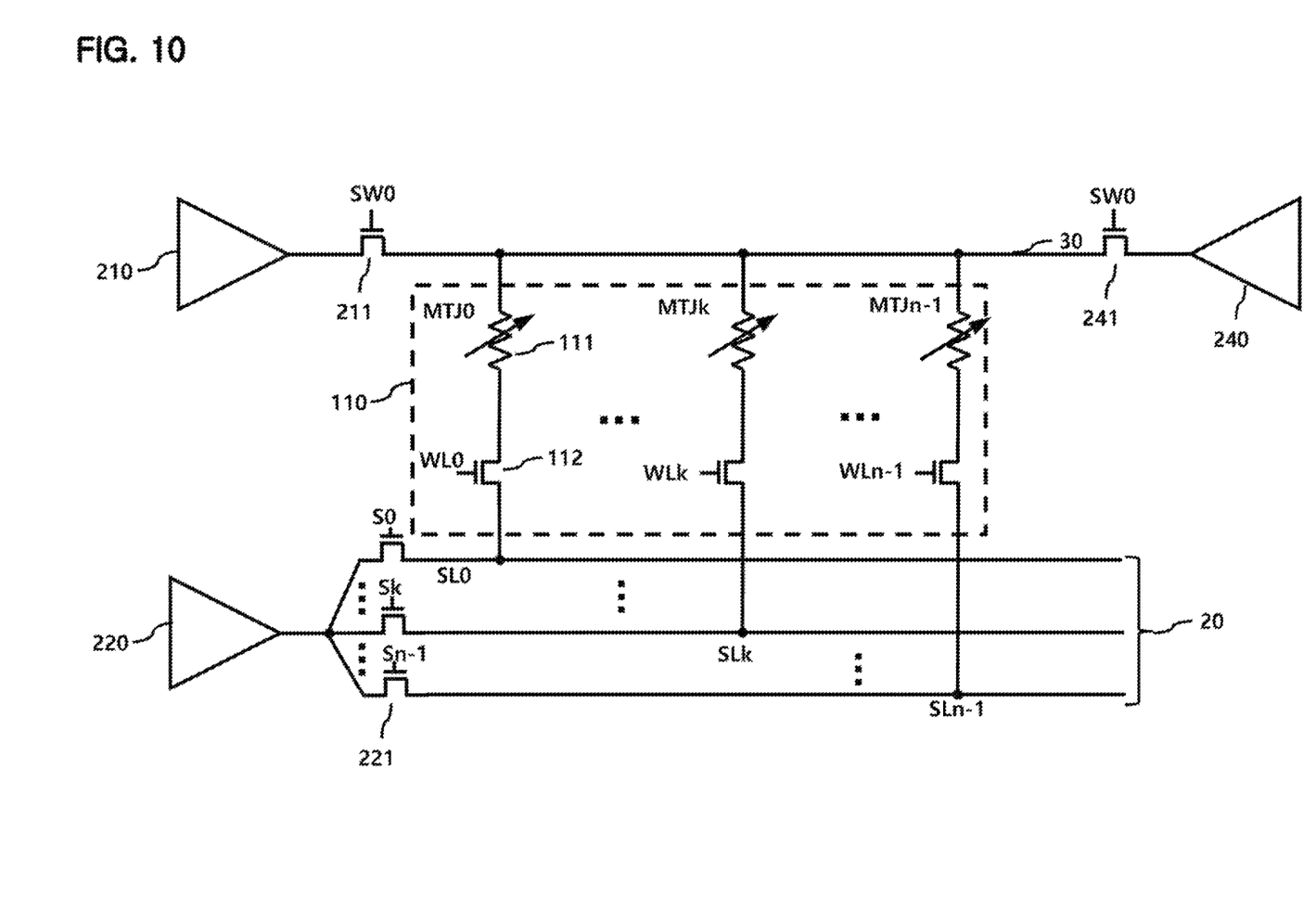
FIG. 10 is a circuit diagram of a magnetic memory device according to a second embodiment.

FIG. 10 illustrates a magnetic memory device according to a second embodiment.

The embodiment of FIG. 10 is substantially the same as the first embodiment of FIG. 4, except for the following components.

The embodiment of FIG. 10 does not include the dummy cell 120, the third driver 230 and the dummy source line 21, but further includes a bit line select switch 241 and a fourth driver 240.

The first driver 210 and the fourth driver 240 may be coupled to the bit line 30 through the bit line select switches 211 and 241 which are controlled according to the bit line select signal SW0.

The first and fourth drivers 210 and 240 may be set independently of each other, and adjust the magnitude and direction of a current flowing through the bit line 30.

When the first driver 210 provides a current, the fourth driver 240 may sink a current, and vice versa.

The magnitude of the current provided by the first driver 210 may be equal to or different from the magnitude of the current sunk by the fourth driver 240. On the other hand, the magnitude of the current provided by the fourth driver 240 may be equal to or different from the magnitude of the current sunk by the first driver 210.

Figure 11:
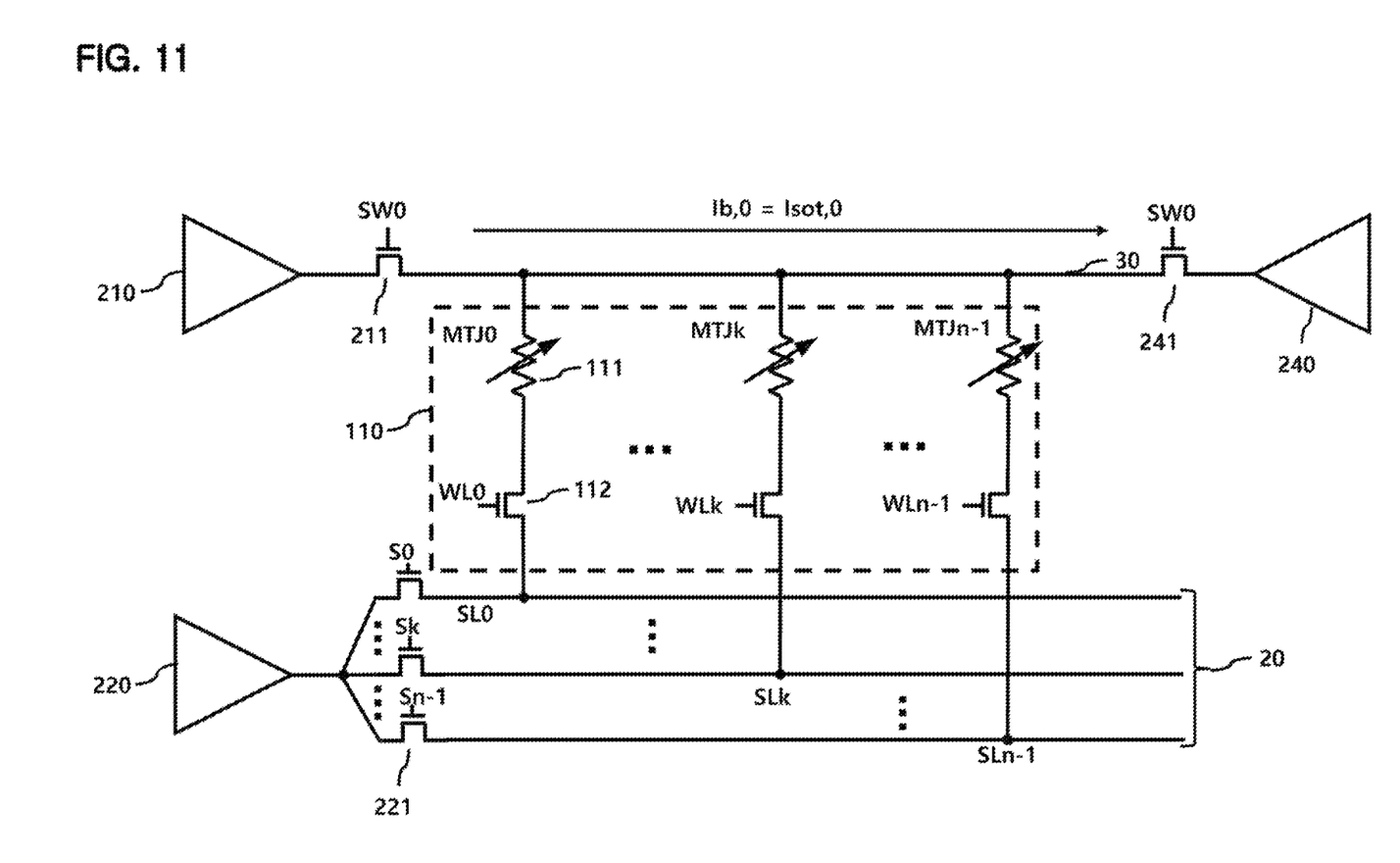
FIGS. 11 and 12 are diagrams for describing operations of the second embodiment.
Figure 12:
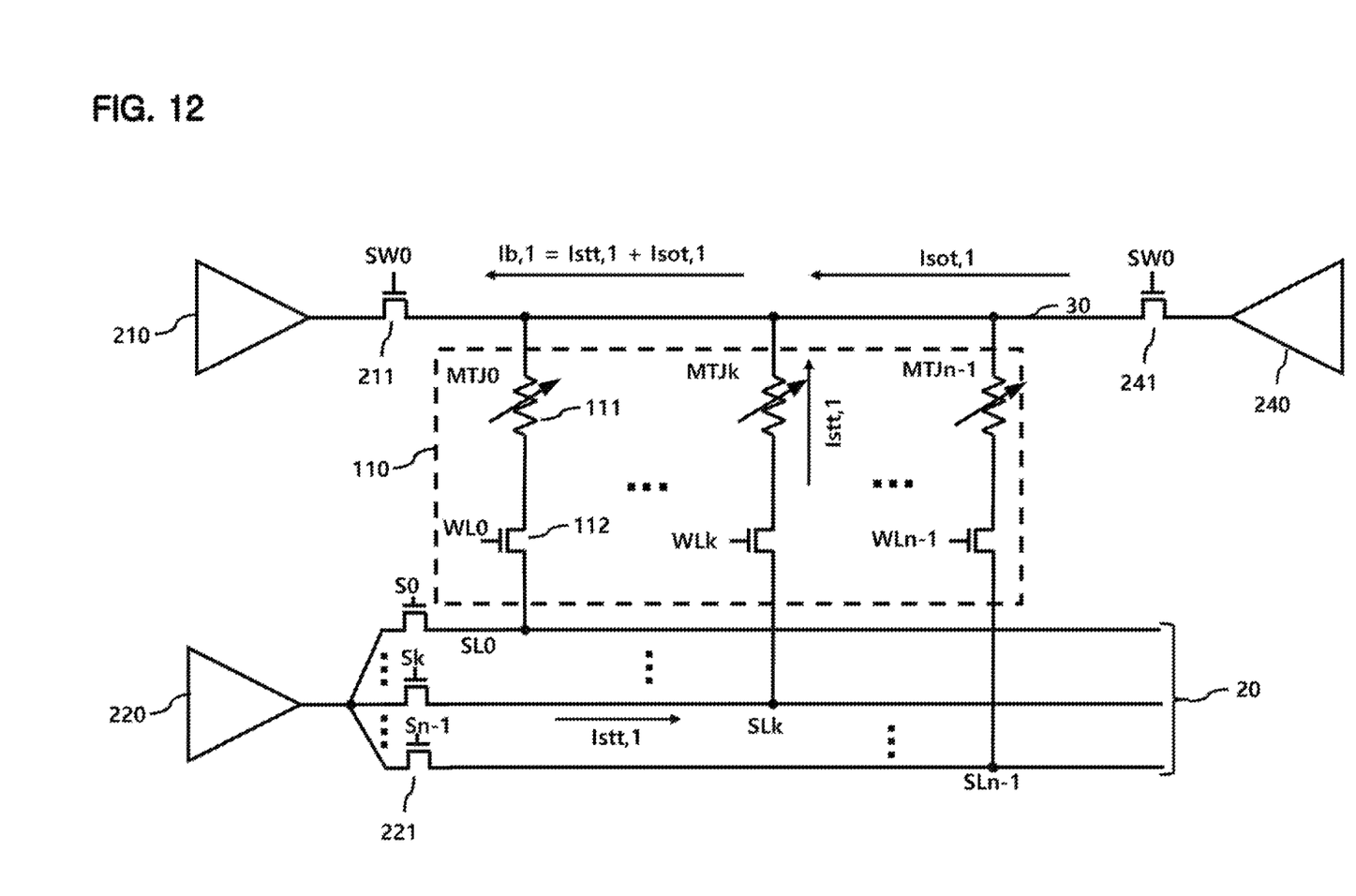

FIGS. 11 and 12 help to illustrate the operation of the second embodiment shown in FIG. 10.

FIG. 11 corresponds to FIG. 6, FIG. 12 corresponds to FIG. 7, and certain basic operations are performed in the same manner as described above with respect to the first embodiment of FIG. 4.

FIG. 11 illustrates an operation of writing 0 to all cells of the plurality of cells coupled to the same bit line 30 using the SOT effect.

For this operation, the first driver 210 is the source of the bit line current $I_{b,0}$, and the fourth driver 240 sinks the same magnitude of bit line current $I_{b,0}$.

FIG. 12 illustrates an operation of writing 1 to a k-th MTJ element MTJk.

For this operation, the fourth driver 240 provides a current $I_{sot,1}$ to the bit line 30, the second driver provides a current $I_{stt,1}$ to the k-th MTJ element MTJk, and the first driver 210 sinks the bit line current ($I_{b,1}=I_{sot,1}+I_{stt,1}$).

As such, in the second embodiment, the fourth driver 240 may substitute for the dummy cell 120 and the third driver 230 of the first embodiment.

According to embodiments of this disclosure, a magnetic memory device can perform a write operation using the STT effect and the SOT effect at the same time, without increasing the size of the cells. Thus, the size of the memory device can be reduced.

Furthermore, a magnetic memory device according to an embodiment of this disclosure can reduce stress applied to the MTJ element, compared to when only the STT effect is used. Thus, the life time of the device can be improved.

Furthermore, during a write operation, the magnetic memory device can write data to an entire block of cells using the SOT effect, and write data to each cell using the SOT effect and the STT effect, thereby improving the write performance.

Although various embodiments have been described for illustrative purposes, it will be apparent to those skilled in the art that various changes and modifications may be made without departing from the spirit and scope of the invention as defined in the following claims.

What is claimed is:

1. A magnetic memory device comprising:
    a bit line;
    a plurality of source lines;
    a plurality of normal cells coupled between the bit line and the plurality of source lines, each normal cell comprising a magnetic resistance element and a switching element coupled in series to the magnetic resistance element, each switching element being switched by a word line signal;
    a dummy cell coupled to the bit line; and
    a spin-hall effect material layer adjacent to the bit line and the magnetic resistance element,
    wherein data is written to the magnetic resistance element using a first current that flows through the dummy cell and is parallel to the magnetic resistance element, and a second current that flows through the magnetic resistance element.

2. The magnetic memory device of claim 1, wherein the dummy cell comprises a resistance element coupled to the bit line and a switching element coupled to the resistance element.

3. The magnetic memory device of claim 2, wherein the first current is varied according to a resistance value of the resistance element.

4. The magnetic memory device of claim 1, further comprising a first driver configured to supply a current to the bit line or sink a current from the bit line.

5. The magnetic memory device of claim 4, further comprising a second driver configured to supply a current to any one of the plurality of source lines or sink a current from any one of the plurality of source lines.

6. The magnetic memory device of claim 5, further comprising a third driver configured to supply a current to the dummy cell or sink a current from the dummy cell.

7. The magnetic memory device of claim 1, wherein the directions of the first and second currents are controlled according to data to be written to the magnetic resistance element.

8. The magnetic memory device of claim 1, wherein the magnetic resistance element comprises an MTJ element having a free layer formed at a position sufficiently close the bit line to change a magnetic spin direction of the free layer when a predetermined current flows through the bit line.

9. The magnetic memory device of claim 1, wherein the plurality of normal cells are coupled to the bit line, and a write operation comprises a first operation of writing first data to the all normal cells in the plurality of normal cells and a second operation of writing second data to a portion of the plurality normal cells.

10. The magnetic memory device of claim 9, wherein a number of the first data is greater than a number of the second data in the write request.

11. The magnetic memory device of claim 9, wherein during the first operation, the switching elements included in the plurality of normal cells are turned off.

12. The magnetic memory device of claim 9, wherein during the second operation, the switching element included in one of the plurality of normal cells is turned on.

13. A magnetic memory device comprising:
a bit line;
a plurality of source lines;
a plurality of magnetic memory cells coupled between the bit line and the plurality of source lines, each cell comprising a magnetic resistance element and a switching element coupled in series to the magnetic resistance element and switched by a word line signal;
a spin-hall effect material layer adjacent to the bit line and the magnetic resistance element;
a first driver coupled to a first terminal of the bit line and configured to supply a current to the bit line or sink a current from the bit line; and
a fourth driver coupled to a second terminal of the bit line and configured to supply a current to the bit line or sink a current from the bit line,
wherein the magnetic resistance element writes data according to a first current that is parallel to the magnetic resistance element and a second current that flows through the magnetic resistance element.

14. The magnetic memory device of claim 13, further comprising a second driver configured to supply a current to any one of the plurality of source lines or sink a current from any one of the plurality of source lines.

15. The magnetic memory device of claim 13, wherein the first and second currents flow in a first direction when writing first data, and flow in a second direction opposite to the first direction when writing second data.

16. The magnetic memory device of claim 13, wherein the magnetic resistance element comprises an MTJ element having a free layer adjacent to the bit line.

17. The magnetic memory device of claim 13, wherein data is written to the plurality of magnetic memory cells by a first operation of writing first data to every cell of the plurality of magnetic memory cells, and a second operation of writing second data to a portion of the plurality of magnetic memory cells.

* * * * *